US005502348A

United States Patent [19]

Moyer et al.

[11] Patent Number: 5,502,348

[45] Date of Patent: Mar. 26, 1996

[54] BALLISTIC CHARGE TRANSPORT DEVICE WITH INTEGRAL ACTIVE CONTAMINANT ABSORPTION MEANS

[75] Inventors: Curtis D. Moyer, Phoenix; Lawrence N. Dworsky; Robert C. Kane, both of Scottsdale, all of Ariz.

[73] Assignee: Motorola, Schaumburg, Ill.

[21] Appl. No.: 169,232

[22] Filed: Dec. 20, 1993

[51] Int. Cl.[6] .............................. H01J 1/46; H01J 17/24; H01L 29/06; H01L 23/58

[52] U.S. Cl. .......................... 313/310; 313/306; 313/553; 257/10; 257/928

[58] Field of Search .................................... 313/306, 307, 313/308, 310, 553, 555; 257/10, 11, 928

[56] References Cited

U.S. PATENT DOCUMENTS

| | | | |
|---|---|---|---|
| 5,144,191 | 9/1992 | Jones | 313/308 |
| 5,214,347 | 5/1993 | Gray | 313/355 |
| 5,223,766 | 6/1993 | Nakayama | 313/495 |
| 5,378,963 | 1/1995 | Ikeda | 313/495 |

*Primary Examiner*—Sandra L. O'Shea
*Assistant Examiner*—John Ning
*Attorney, Agent, or Firm*—Eugene A. Parsons

[57] ABSTRACT

A ballistic charge transport device including an edge electron emitter defining an elongated central opening therethrough with a receiving terminal (e.g. an anode) at one end of the opening and a getter at the other end. A suitable potential is applied between the emitter and the receiving terminal to attract emitted electrons to the receiving terminal and a different suitable potential is applied between the emitter and the getter so that contaminants, such as ions and other undesirable particles, are accelerated toward and absorbed by the getter.

18 Claims, 2 Drawing Sheets

BALLISTIC CHARGE TRANSPORT DEVICE WITH INTEGRAL ACTIVE CONTAMINANT ABSORPTION MEANS

FIELD OF THE INVENTION

This invention relates generally to ballistic charge transport devices and more particularly to a ballistic charge transport device employing an ion protection means.

BACKGROUND OF THE INVENTION

Charge transport devices are known and commonly employed as electronic devices for communicating or creating electronic signals. Positively or negatively charged particles such as, for example, positively charged molecules, positively charged atoms, or negatively charged electrons may be transported ballistically within such devices. The charged particles typically emanate from a source within the device and are subsequently received at a terminal within the device designed to accept the particles.

In many instances the transport of charged particles within a ballistic charge transport device is aided by the presence of an electric field. As charged particles traverse an electric field, energy is transferred to the particle and is observed as a kinetic energy gain.

Particles having appreciable kinetic energy and impinging on a receiving terminal may cause undesirable emanation of similarly or oppositely charged particles from the terminal at which the desired particles are received. Oppositely charged undesired particles emanating from the receiving terminal and in the presence of the electric field will be accelerated toward the source of desired particles where they will impact on and damage the source.

Ballistic charge transport devices typically provide for transport of charged particles within an evacuated region. Desorption of adsorbed contaminants which may have been adhered to surfaces within the device will result in a degradation to the integrity of the evacuated region. Such desorption of adsorbed constituents provides an opportunity for contaminants to intrude within the region of desired charged particle trajectories (as desired charged particles traverse the region from source to receiving terminal) and to themselves become charged as a result of impact with the desired charged particles. Charged contaminates may then, under influence of the electric field, accelerate toward the desired charged particle source and cause the source to be contaminated or damaged.

It is known that by providing surface area coatings of preferred elemental solids such as, for example, titanium, barium, or zirconium oxide, within an evacuated electronic device contaminants may be selectively absorbed.

However, such coatings are not compatible with nor will they provide for the desired operation of some ballistic charge transport devices. Many such coatings are metallic conductors and, as such, unsuitable for particular applications. Further, since such coatings rely on the random motion of the contaminants the probability of absorption of contaminants by such a coating rather than impingement of the contaminant particle at the source is less than that which is desired.

Accordingly, there exists a need for a ballistic charge transport device which overcomes at least some of the shortcomings herein described.

SUMMARY OF THE INVENTION

This need, and others, is substantially met through provision of a ballistic charge transport device including an active device assembly with a charged particle source layer having first and second opposed surfaces and designed to emanate desired particles, first and second insulator layers positioned one on each of the first and second charged particle source layer surfaces, and first and second electric field particle extraction layers one each disposed on one of the first and second insulator layers. A receiving terminal is also provided for receiving desired charged particles emanating from the source. The receiving terminal is distally disposed with respect to the active device assembly and defines a transport region therebetween, such that desired charged particles emanating from the source traverse the transport region and are received at the receiving terminal. A contaminant absorption layer with an affinity to absorb charged and uncharged atomic and molecular contaminants is positioned relative to the active device assembly and the receiving terminal such that contaminant particles emanating from the receiving terminal and desorbed from other device surfaces are preferentially absorbed at the contaminant absorption layer.

Operably connecting an electrical potential source such as, for example, a voltage source, between the contaminant absorption layer and the charged particle source layer and providing a suitable potential therebetween effects the preferential absorption of undesirable contaminant residuals at the contaminant absorption layer.

DETAILED DESCRIPTION OF THE DRAWINGS

Figure 1:
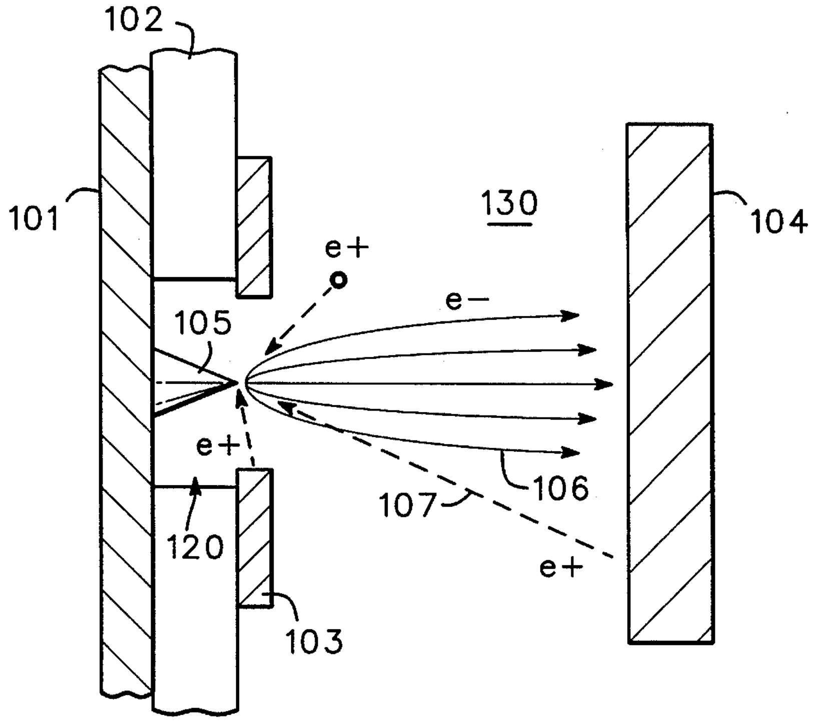
FIG. 1 is a partial side-elevational schematic representation of a ballistic charge transport device.

Referring now to FIG. 1 there is depicted a partial side-elevational schematic representation of an embodiment of a charged particle transport device 100. In the embodiment of FIG. 1, a supporting substrate 101 has disposed thereon an insulator layer 102 having an aperture 120 defined therethrough. A conductive electrode 103 is disposed on insulator layer 102 and substantially peripherally with respect to aperture 120. A charged particle source 105, for emanating charged particles such as some of ionic atoms, ionic molecules, or electrons is disposed on and operably coupled to supporting substrate 101 and substantially axially symmetrically within aperture 120. A receiving terminal 104, for receiving charged particles emanated from charged particle source 105, is distally disposed with respect to charged particle source 105 and defines a transport region 130 therebetween.

Operationally, charged particles 106 such as, for example, one of atoms, molecules, and electrons may desirably emanate from charged particle source 105 and may be subsequently received at receiving terminal 104. (Schematically, negatively charged particles such as, for example, electrons are herein depicted with the symbol "e–" and positively charged particles such as, for example, positively charged ions are herein depicted with the symbol "e+".) Coincidentally, undesired atomic, molecular, or electron constituents 107 (depicted as dashed lines with arrowheads) may be emanated from receiving terminal 104 and also may be desorbed from any of the surfaces associated with the various physical components of the device. Such undesired constituents (contaminants) 107 may randomly traverse the extent of transport region 130 to arrive at charged particle source 105. Impact of contaminants 107 with charged particle source 105 may result in damage or destruction of charged particle source 105. Adsorption of contaminants 107 at charged particle source 105 may change the physical characteristics of charged particle source 105 and result in degradation of performance of device 100.

Figure 2:
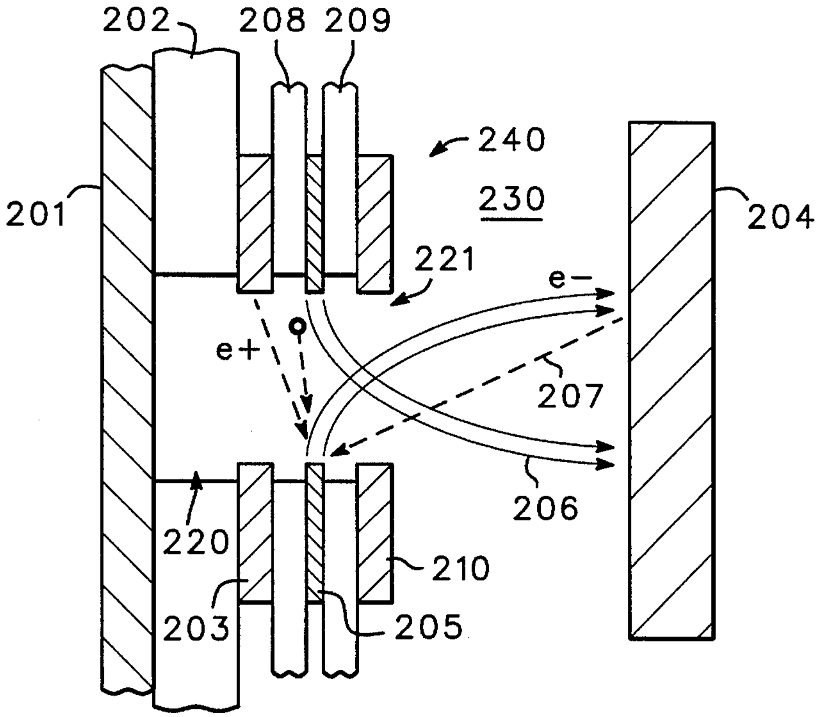
FIG. 2 is a partial side-elevational schematic representation of another ballistic charge transport device.

FIG. 2 is a partial side-elevational schematic representation of another embodiment of a ballistic charge transport device 200 wherein features previously described in FIG. 1 are similarly referenced beginning with the numeral "2". It should be observed that in FIG. 2 an active device assembly 240 is comprised of a plurality of layers disposed on first insulating layer 202 and including: a charged particle source, realized as a charged particle source layer 205, having first and second opposed surfaces, second and third insulator layers 208, 209 disposed (in operable communication) one on each of the first and second surfaces of charged particle source layer 205, and first and second electric field particle extraction electrodes 203, 210 disposed one each on either of second and third insulator layers 208, 209. First particle extraction electrode 203 is disposed on first insulator layer 202 to mount assembly 240 within transport region 230. Particle source layer 205, insulator layers 208, 209 and particle extraction electrodes 203, 210 have an assembly aperture 221 defined therethrough and substantially in axial symmetric registration with aperture 220 in first insulating layer 202.

Figure 3:
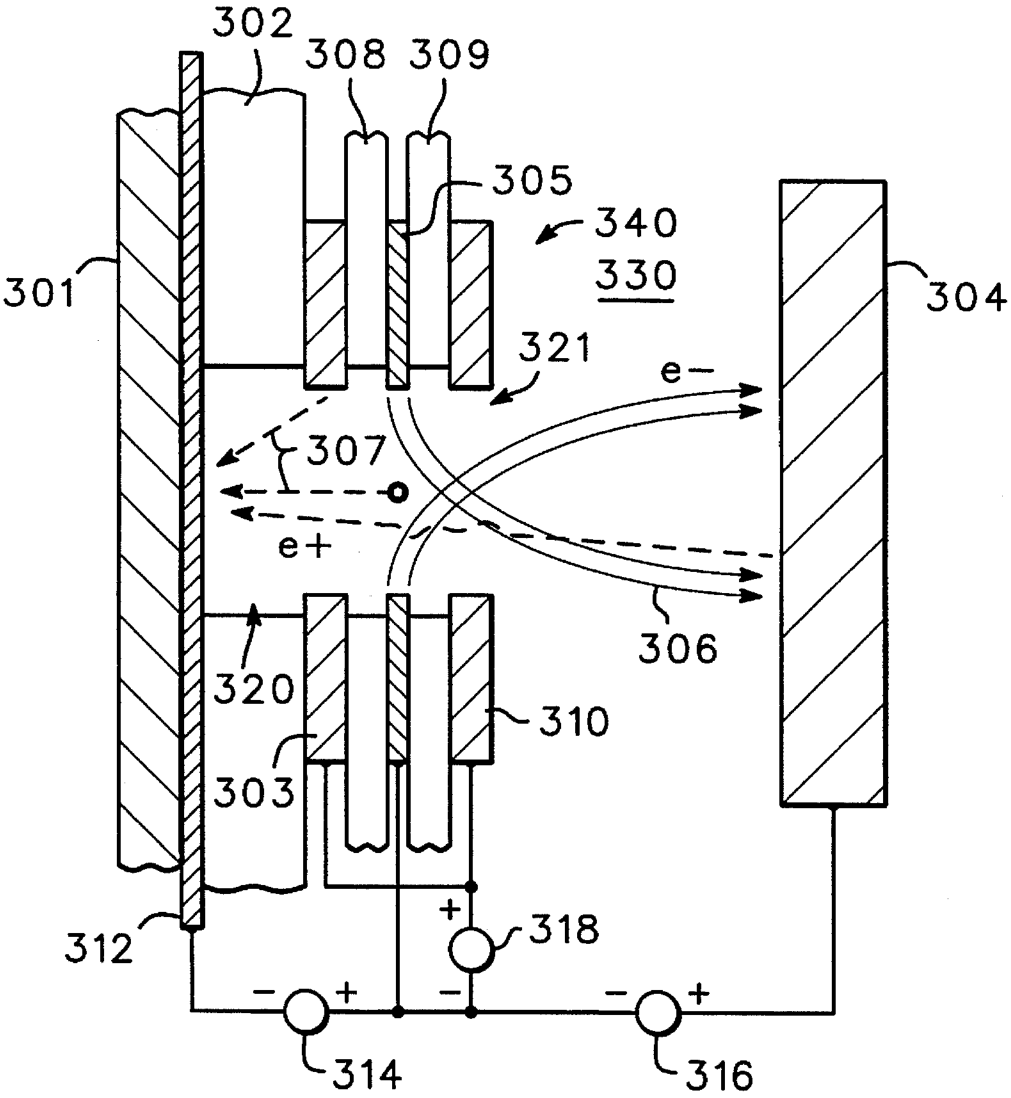
FIG. 3 is a side-elevational schematic representation of an embodiment of a ballistic charge transport device in accordance with the present invention.

FIG. 3 is a partial side-elevational schematic representation of an embodiment of a ballistic charge transport device 300 in accordance with the present invention and wherein features previously described with reference to FIGS. 1 and 2 are herein similarly referenced beginning with the numeral "3". For device 300 of FIG. 3 supporting substrate 301 has associated therewith a major surface on which is disposed an integrally formed contaminant absorption layer 312. Contaminant absorption layer 312 may be deposited by any of many known methods including for example and not limited to, sputtering or evaporation of material such as one of titanium, barium, and zirconium oxide. Thus, aperture 320 through insulating layer 302 and aperture 321 through active device assembly 340, which are axially aligned, define a generally cylindrical aperture. Further, contaminant absorption layer 312 is positioned at one end of the axis of the aperture and receiving terminal 304 is positioned oppositely or at the other end of the axis.

A first electrical potential source 314, such as a voltage source, is operably coupled between contaminant absorption layer 312 and charged particle source layer 305. A second electrical potential source 316, such as a voltage source, is operably coupled between receiving terminal 304 and charged particle source layer 305. A third electrical potential source 318, such as a voltage source, is operably coupled between electric field particle extraction layers 303, 310 and charged particle source layer 305.

First and second electric field particle extraction layers 303, 310, with electrical potential source 318 coupled thereto and providing a suitable potential, are employed to induce an electric field proximal to charged particle source layer 305 so as to control the emanation of charged particles therefrom. Upon application of a suitable potential, provided by electrical potential source 314, between contaminant absorption layer 312 and charged particle source layer 305, undesirable particle constituents including some of ionic, atomic and molecular particles and electrons will be preferentially accelerated toward contaminant absorption layer 312. Electrical potential source 316 provides a potential between charged particle source layer 305 and receiving terminal 304 to facilitate the transport of charged particles 306 across the extent of transport region 330. Contaminants 307 such as undesirable charged particles emanating from receiving terminal 304 and desorbed atomic and molecular ionic residuals which are disposed as gaseous constituents in transport region 330 and in aperture 320 are preferentially accelerated toward and retained at contaminant absorption layer 312 by virtue of the field provided by electrical potential source 314.

Other embodiments of the present invention may employ an additional electrical potential source operably coupled directly to source layer 305 in which instance a common point of operable connection for each of the potential sources may be a reference potential such as, for example, ground potential.

Embodiments of the ballistic charge transport devices considered in the present invention are typically microelectronic structures. For example, the aperture diameter is on the order of from one micron to a few hundred microns. The extent of the transport region is on the order of a few microns to a few millimeters. Layer thicknesses of the active device assembly, of which the ballistic charge transport device is comprised, are on the order of less than one micron to a few microns.

One desirable feature of the integrally formed contaminant absorption layer 312 is that it will exhibit an inherent affinity to absorb charged and uncharged atomic and molecular contaminants which become incident at or impinge upon the layer 312.

It is one object of the present invention to provide a ballistic charge transport device with an integrally formed contaminant absorption layer which acts to maintain the integrity of an evacuated region which provides the operating environment of the device.

Thus, a ballistic charge transport device has been disclosed which includes an integrally formed contaminant absorption layer that acts to reduce the occurrence of damaging contaminant incidence at a charged particle source layer. Further, a ballistic charge transport device has been disclosed which includes an integrally formed contaminant absorption layer and an electrical potential source, such as a voltage source, for accelerating undesirable ionic gaseous constituents, whether desorbed atomic or molecular components or atomic and molecular components emanating from a receiving terminal, away from a charged particle source layer and toward the integrally formed contaminant absorption layer.

What is claimed is:

1. A ballistic charge transport device comprising:

a supporting substrate having a major surface;

an integrally formed contaminant absorption layer having an affinity to absorb charged and uncharged atomic and molecular contaminants disposed on the major surface;

a first insulating layer disposed on the contaminant absorption layer and having a first insulator aperture defined therethrough so as to expose a portion of the contaminant absorption layer;

an active device assembly comprised of a plurality of layers disposed on the first insulating layer and including:

a charged particle source layer having first and second surfaces and designed to emanate desired particles;

second and third insulator layers in operable communication one on each of the first and second charged particle source layer surfaces;

first and second electric field particle extraction layers one each disposed on one of the second and third insulator layers, and an assembly aperture defined therethrough and substantially in registration with the first insulator aperture; and a receiving terminal, for receiving desired charged particles emanating from the source, distally disposed with respect to the active device assembly and defining a transport region therebetween, such that desired charged particles emanating from the source are received at the receiving terminal and contaminant particles emanating from the receiving terminal and desorbed from other device surfaces are preferentially absorbed at the contaminant absorption layer.

2. A ballistic charge transport device as claimed in claim 1 and further including a first electrical potential source operably connected between the contaminant absorption layer and the charged particle source layer such that upon application of a suitable potential difference between the contaminant absorption layer and the charged particle source layer charged contaminants will be preferentially accelerated to the contaminant absorption layer and away from the charged particle source layer.

3. A ballistic charge transport device as claimed in claim 2 and further including a second electrical potential source operably connected between the charged particle source layer and the receiving terminal such that upon application of a suitable potential charged particles emanating from the charged particle source layer are preferentially received at the receiving terminal subsequent to traversing the transport region.

4. A ballistic charge transport device as claimed in claim 1 wherein the contaminant absorption layer includes one of titanium, barium, and zirconium.

5. A ballistic charge transport device comprising:

an active device assembly including a charged particle source layer having first and second opposed surfaces and designed to emanate desired particles, first and second insulator layers positioned one on each of the first and second charged particle source layer surfaces, and first and second electric field particle extraction layers one each disposed on one of the first and second insulator layers;

a receiving terminal, for receiving desired charged particles emanating from the source, distally disposed with respect to the active device assembly and defining a transport region therebetween, such that desired charged particles emanating from the source traverse the transport region and are received at the receiving terminal; and a contaminant absorption layer having an affinity to absorb charged and uncharged atomic and molecular contaminants and positioned relative to the active device assembly and the receiving terminal such that contaminant particles emanating from the receiving terminal and desorbed from other device surfaces are preferentially absorbed at the contaminant absorption layer.

6. A ballistic charge transport device as claimed in claim 5 and further including a first electrical potential source operably connected between the contaminant absorption layer and the charged particle source layer such that upon application of a suitable potential difference between the contaminant absorption layer and the charged particle source layer charged contaminants will be preferentially accelerated to the contaminant absorption layer and away from the charged particle source layer.

7. A ballistic charge transport device as claimed in claim 6 and further including a second electrical potential source operably connected between the charged particle source layer and the receiving terminal such that upon application of a suitable potential charged particles emanating from the charged particle source layer are preferentially received at the receiving terminal subsequent to traversing the transport region.

8. A ballistic charge transport device as claimed in claim 5 wherein the active device assembly includes a generally cylindrical aperture defined therethrough such that particles emanate from the source into the aperture and the receiving terminal is positioned at one end of an axis of the aperture and the contaminant absorption layer is positioned at another end of the axis of the aperture.

9. A ballistic charge transport device as claimed in claim 5 wherein the contaminant absorption layer includes one of titanium, barium, and zirconium.

10. A method of removing contaminants from a ballistic charge transport device comprising the steps of:

providing a ballistic charge transport device including an active device assembly with a charged particle source layer having first and second opposed surfaces and designed to emanate desired particles, first and second insulator layers positioned one on each of the first and second charged particle source layer surfaces, first and second electric field particle extraction layers one each disposed on one of the first and second insulator layers, and a receiving terminal, for receiving desired charged particles emanating from the source, distally disposed with respect to the active device assembly and defining a transport region therebetween, such that desired charged particles emanating from the source traverse the transport region and are received at the receiving terminal; and providing a contaminant absorption layer having an affinity to absorb charged and uncharged atomic and molecular contaminants and positioning the contaminant absorption layer relative to the active device assembly and the receiving terminal such that contaminant particles emanating from the receiving terminal and desorbed from other device surfaces are preferentially absorbed at the contaminant absorption layer.

11. A method as claimed in claim 10 wherein the step of positioning the contaminant absorption layer includes distally disposing the contaminant absorption layer with respect to the active device assembly generally opposite to the receiving terminal.

12. A method as claimed in claim 10 including in addition the step of operably connecting a first electrical potential source between the contaminant absorption layer and the charged particle source layer such that upon application of a suitable potential difference between the contaminant absorption layer and the charged particle source layer charged contaminants will be preferentially accelerated to the contaminant absorption layer and away from the charged particle source layer.

13. A method as claimed in claim 12 including in addition the step of operably connecting a second electrical potential source between the charged particle source layer and the receiving terminal such that upon application of a suitable potential charged particles emanating from the charged particle source layer are preferentially received at the receiving terminal subsequent to traversing the transport region.

14. A method as claimed in claim 10 including in addition the step of providing a substrate and mounting the active device assembly of the ballistic charge transport device on the substrate.

15. A method as claimed in claim 14 wherein the step of positioning the contaminant absorption layer includes positioning the contaminant absorption layer on the substrate.

16. A method as claimed in claim 10 wherein the step of providing a ballistic charge transport device including an active device assembly further includes forming the active device assembly with an aperture therethrough such that particles emanate from the source into the aperture and distally disposing the receiving terminal with respect to the aperture.

17. A method as claimed in claim 16 wherein the step of forming the active device assembly with an aperture therethrough includes forming a generally cylindrical aperture and positioning the receiving terminal at one end of an axis of the aperture and positioning the contaminant absorption layer at another end of the axis of the aperture.

18. A method as claimed in claim 10 wherein the step of providing a contaminant absorption layer includes providing a contaminant absorption layer including one of titanium, barium, and zirconium.

* * * * *